United States Patent
Chuang et al.

(10) Patent No.: US 11,314,175 B2
(45) Date of Patent: Apr. 26, 2022

(54) RETICLE POD HAVING POSITIONING MEMBER

(71) Applicant: GUDENG PRECISION INDUSTRIAL CO., LTD., New Taipei (TW)

(72) Inventors: Chia-Ho Chuang, New Taipei (TW); Hsing-Min Wen, New Taipei (TW); Yi-Hsuan Lee, New Taipei (TW); Hsin-Min Hsueh, New Taipei (TW); Ming-Chien Chiu, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 119 days.

(21) Appl. No.: 17/023,409

(22) Filed: Sep. 17, 2020

(65) Prior Publication Data
US 2022/0026818 A1 Jan. 27, 2022

(30) Foreign Application Priority Data
Jul. 23, 2020 (TW) .................................. 109124946

(51) Int. Cl.
*G03F 7/20* (2006.01)
*H01L 21/673* (2006.01)
*H01L 21/677* (2006.01)

(52) U.S. Cl.
CPC .... *G03F 7/70741* (2013.01); *H01L 21/67359* (2013.01); *H01L 21/67769* (2013.01)

(58) Field of Classification Search
CPC ......... H01L 21/67359; H01L 21/67373; H01L 21/67769; H01L 21/67353; G03F 7/70741; G03F 1/66
See application file for complete search history.

(56) References Cited

U.S. PATENT DOCUMENTS

2011/0155598 A1* 6/2011 Lu .............................. G03F 1/66
206/349

\* cited by examiner

*Primary Examiner* — Mesfin T Asfaw

(57) ABSTRACT

A reticle pod having a positioning member includes a base, a lid and a plurality of positioning members. The lid shuts relative to the base to form a substantially cuboid case. The case has a storing space for receiving a reticle. The positioning members are arranged in a shutting direction and disposed on at least two edges of the lid or at least two edges of the base, respectively. The positioning members each include a connecting portion, a correcting portion and a guiding slope portion. The connecting portion connects the edges of the lid. The correcting portion has one end connected to the connecting portion and extending in a shutting direction and an opposing end connected to the guiding slope portion. The guiding slope portion has a slope extending outward. The reticle pod having a positioning member is error-free, allowing the lid to shut precisely relative to the base.

10 Claims, 5 Drawing Sheets

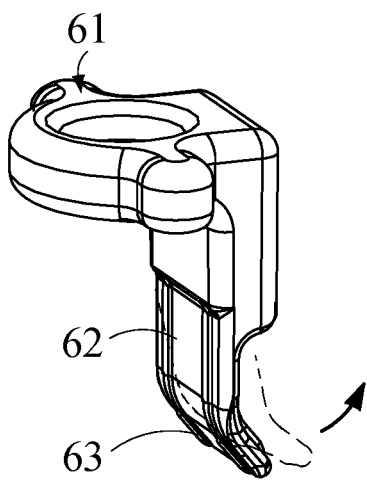
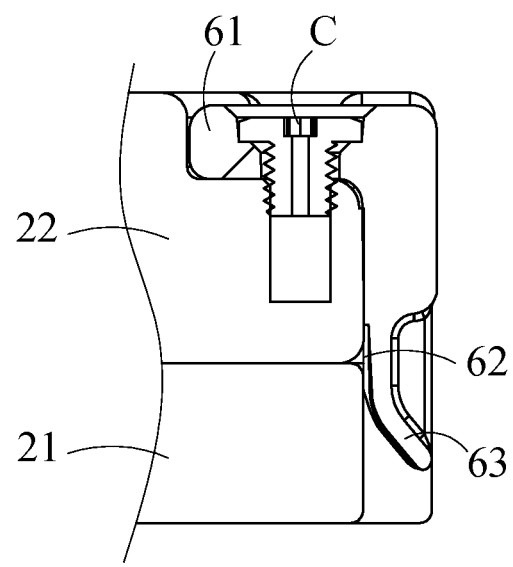
FIG. 6A    FIG. 6B
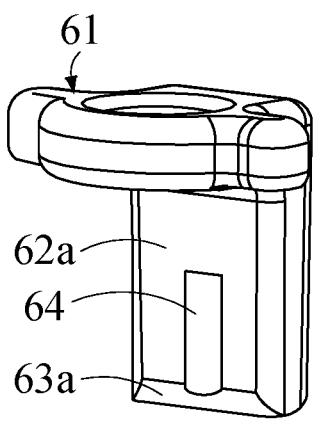
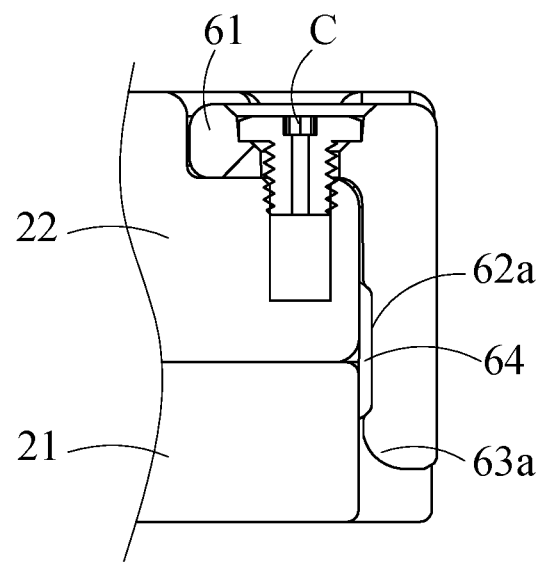
FIG. 7A    FIG. 7B

RETICLE POD HAVING POSITIONING MEMBER

CROSS-REFERENCE TO RELATED APPLICATION

This non-provisional application claims priority under 35 U.S.C. § 119(a) on Patent Application No(s). 109124946 filed in Taiwan, R.O.C. on Jul. 23, 2020, the entire contents of which are hereby incorporated by reference.

BACKGROUND OF THE INVENTION

1. Field of the Invention

The present disclosure relates to carriers for containing fragile items, and in particular to a reticle pod having a positioning member.

2. Description of the Related Art

Photolithography is an important process in the manufacturing of integrated circuits and any other semiconductor devices. In general, photolithography involves exposing selectively a wafer surface to a radiation source to form an etching surface layer, using a reticle with specific patterns. The reticle is usually a flat transparent quartz with patterns to be reproduced on the wafer surface. To meet strict requirements for surface cleanliness and miniaturization of essential components of modern integrated circuits, the operating surface of the reticle must be free of contaminants which damage the surfaces of the essential components of modern integrated circuits during the processing process or distort images projected onto photoresist layers to the detriment of the quality of end products.

In general, the reticle is stored (and/or transported while being contained) in a microclean room environment maintained in a case or container which not only has a lid and a base but also conforms with the Standard Mechanical Interface Format (SMIF). The lid and the base match and thus together form a reticle pod which provides an airtight hermetic seal required for the reticle.

During an extreme ultraviolet photolithography process, the reticle pod opens and shuts by automation but is predisposed to errors in its alignment with its workstation. The alignment errors not only prevent the lid from shutting relative to the base quickly and precisely but also cause multiple collisions between the lid and base and abrasions thereto. As a result, not only does the reticle pod fail to protect the reticle therein, but particles undesirably generated because of friction also contaminate the reticle. Therefore, it is necessary to provide a device that assists with workstation positioning.

BRIEF SUMMARY OF THE INVENTION

An objective of the present disclosure is to provide a reticle pod having a positioning member.

To achieve at least the above objective, the present disclosure provides a reticle pod having a positioning member, comprising: a base having a plurality of edges; a lid having a plurality of edges and adapted to shut relative to the base so as to form a substantially cuboid case, the case having a storing space for receiving a reticle; and a plurality of positioning members arranged in a shutting direction and disposed on at least two edges of the lid, respectively, the positioning members each comprising a connecting portion, a correcting portion and a guiding slope portion, the connecting portion being connected to the edges of the lid, wherein the correcting portion has an end connected to the connecting portion and extending in the shutting direction and an opposing end connected to the guiding slope portion, the guiding slope portion having a slope extending outward.

In an embodiment of the present disclosure, the positioning member further has at least one rib extending from an inner surface of the correcting portion to the storing space.

In an embodiment of the present disclosure, the positioning member further has at least one bump portion extending from an inner surface of the correcting portion to the storing space.

In an embodiment of the present disclosure, the positioning members are disposed at two ends of each edge of the lid, respectively.

In an embodiment of the present disclosure, the positioning member is a slender lateral plate.

In an embodiment of the present disclosure, the edges of the base each have an inner retracted segment corresponding in position to the positioning member.

In an embodiment of the present disclosure, the connecting portion has a screw hole.

In an embodiment of the present disclosure, the correcting portion and the guiding slope portion are elastomer.

In an embodiment of the present disclosure, the positioning member further has a clamping element disposed on an inner surface of the correcting portion and facing the storing space.

In an embodiment of the present disclosure, the reticle pod having a positioning member further comprises an outer case, the outer case comprising an outer case lid and an outer case base, wherein the outer case provides therein a placement space for holding the case when the outer case lid shuts relative to the outer case base.

The present disclosure further provides a reticle pod having a positioning member, comprising: a base having a plurality of edges; a lid having a plurality of edges and adapted to shut relative to the base so as to form a substantially cuboid case, the case having a storing space for receiving a reticle; and a plurality of positioning members arranged in a shutting direction and disposed on at least two edges of the base, respectively, the positioning members each comprising a connecting portion, a correcting portion and a guiding slope portion, the connecting portion being connected to the edges of the lid, wherein the correcting portion has an end connected to the connecting portion and extending in the shutting direction and an opposing end connected to the guiding slope portion, the guiding slope portion having a slope extending outward.

Therefore, the reticle pod having a positioning member according to the present disclosure is advantageous in that if the lid and the base have an alignment error in X-axis direction or Y-axis direction, the slope of the guiding slope portion comes into contact with the base, and the base moves along the slope and thus is guided to come into contact with the correcting portion, allowing the lid to shut relative to the base precisely and quickly with minimal contact therebetween. Once the lid finishes shutting relative to the base precisely, the positioning members will fix the base in place and prevent the base and lid from rotating relative to each other.

BRIEF DESCRIPTION OF THE DRAWINGS

FIG. 6A is a perspective view of the fourth aspect of the positioning member according to an embodiment of the present disclosure.

FIG. 6B is a cross-sectional view of the fourth aspect of the positioning member according to an embodiment of the present disclosure.

FIG. 7A is a perspective view of the fifth aspect of the positioning member according to an embodiment of the present disclosure.

FIG. 7B is a cross-sectional view of the fifth aspect of the positioning member according to an embodiment of the present disclosure.

DETAILED DESCRIPTION OF THE INVENTION

To facilitate understanding of the object, characteristics and effects of this present disclosure, embodiments together with the attached drawings for the detailed description of the present disclosure are provided.

Figure 1:
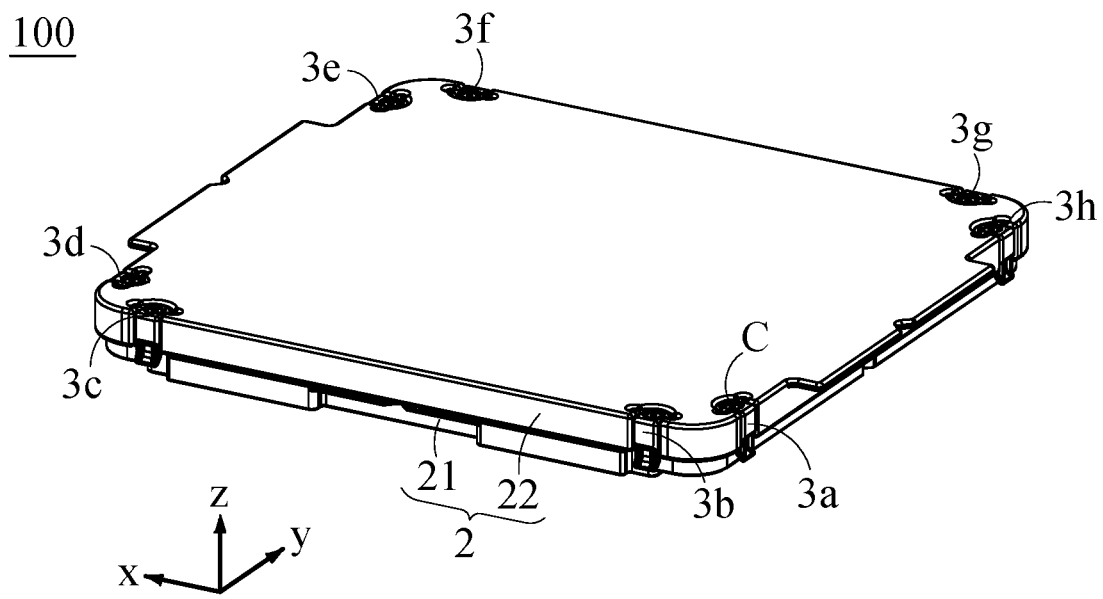
FIG. 1 is a perspective view of a reticle pod having a positioning member according to the first embodiment of the present disclosure.
Figure 2:
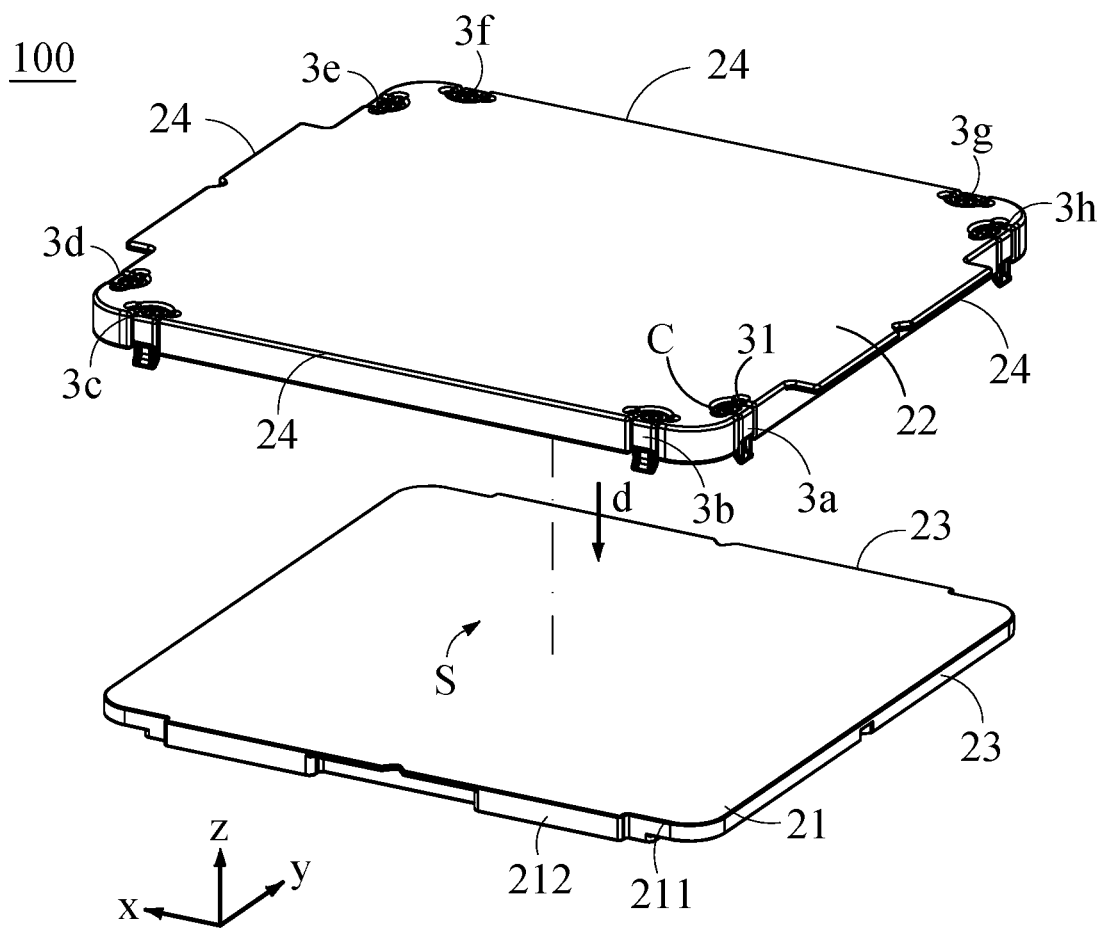
FIG. 2 is an exploded view of the reticle pod having a positioning member according to the first embodiment of the present disclosure.

Referring to FIG. 1 and FIG. 2, in the first embodiment of the present disclosure, a reticle pod 100 having a positioning member comprises a base 21, a lid 22 and a plurality of positioning members.

The base 21 has a plurality of edges 23.

The lid 22 has a plurality of edges 24. The lid 22 shuts relative to the base 21 to form a substantially cuboid case 2 which, when viewed from above, looks substantially rectangular and has four edges. The case 2 has a storing space S for receiving a reticle R (shown in FIG. 5). In this embodiment, corners of the case 2 are rounded to reduce friction and decrease the chance of collisions, but the present disclosure is not limited thereto.

The plurality of positioning members are disposed on at least two edges 24 of the lid 22 and arranged in a shutting direction d of the lid 22. In this embodiment, eight positioning members 3a, 3b, 3c, 3d, 3e, 3f, 3g, 3h are disposed at four edges 24 of the lid 22 and arranged in a shutting direction d of the lid 22. The eight positioning members are disposed at the two ends of each of the four edges and positioned proximate to the corners of the case 2, respectively. The eight positioning members are provided for the sake of weight balance and beauty, but the present disclosure is not limited thereto. In a variant embodiment, the positioning members are in any other number and arranged in any other ways.

For example, the positioning members are in the number of four and are disposed on the four edges 24 of the lid 22, respectively. In other words, only the positioning members 3a, 3c, 3e, 3g of FIG. 1 are provided, allowing one positioning member to be disposed on each edge and at each corner.

In another example, the positioning members are in the number of four and are disposed on the four edges 24 of the lid 22, respectively. In other words, only the positioning members 3a, 3b, 3e, 3f of FIG. 1 are provided, allowing one positioning member to be disposed on each edge and at, two of the four positioning members at one corner of the case 2, the other two at the diagonal corner.

In a variant embodiment, the four positioning members are disposed at the middle of each of the four edges rather than positioned proximate to the corners of the case 2, respectively.

To reduce the required number of the positioning members, the reticle pod having a positioning member according to the present disclosure can have a minimum of two positioning members disposed on two adjacent edges 24 of the lid 22, respectively. The two positioning members are positioning members 3a, 3b (both at one corner) of FIG. 1, positioning members 3a, 3c (at adjacent corners respectively) of FIG. 1, or positioning members 3a, 3f (at diagonal corners respectively) of FIG. 1, but the present disclosure is not limited thereto. The present disclosure will work, provided that the two positioning members facilitate positioning in X-axis direction and positioning in Y-axis direction as shown in the diagrams.

Figure 3A:
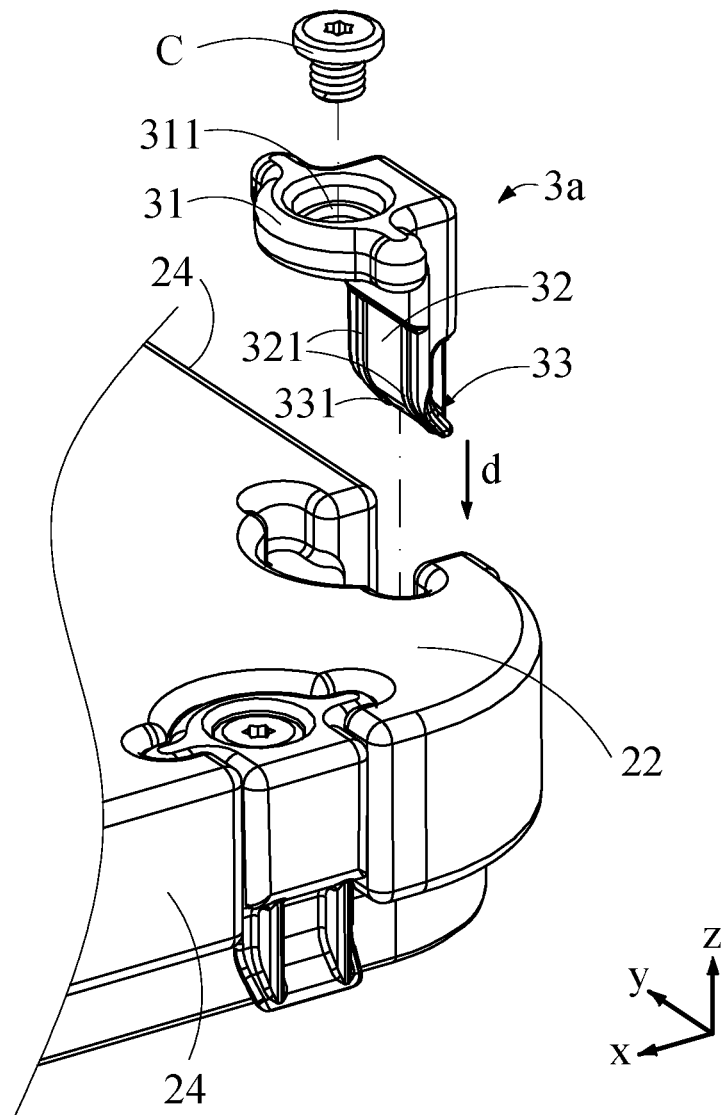
FIG. 3A is a perspective view of the first aspect of the positioning member according to an embodiment of the present disclosure.

Referring to FIG. 3A, the positioning members are exemplified by the positioning member 3a, which comprises a connecting portion 31, a correcting portion 32 and a guiding slope portion 33. The connecting portion 31 connects the edges 24 of the lid 22. One end of the correcting portion 32 connects to the connecting portion 31 and extends in a shutting direction d. The other end of the correcting portion 32 is connected to the guiding slope portion 33. The guiding slope portion 33 has a slope 331 extending outward.

Referring to FIG. 2, when the lid 22 and the base 21 have an alignment error in X-axis direction or Y-axis direction while the lid 22 is shutting relative to the base 21, the slope 331 of the guiding slope portion 33 comes into contact with the base 21, such that the slope 331 guides the base 21 to come into contact with the correcting portion 32; thus, the lid 22 shuts relative to the base 21 precisely with minimal contact therebetween. Once the lid 22 finishes shutting relative to the base 21 precisely, the positioning members will fix the base 21 in place and prevent the base 21 and lid 22 from rotating relative to each other. Preferably, there is a gap of 0.2 mm or so between each positioning member and the base 21. The positioning members are made of polyetheretherketone (PEEK), fluorinated hydrocarbon rubber (KFM), polycarbonate (PC), aluminum, stainless steel, or any other durable material.

Referring to FIG. 2 and FIG. 3A, in an example, the connecting portion 31 has a screw hole 311 which meshes with a screw C to fasten the positioning members to the lid 22. However, the present disclosure is not limited thereto. In a variant embodiment, the positioning members are connected to the lid 22 or base 21 by any other means, such as a means of engagement.

Referring to FIG. 3A, in an example, the positioning member 3a further has at least one rib 321 which extends from the inner surface of the correcting portion 32 to the storing space S. The rib 321 further reduces the possible area of contact between the positioning member 3a and the base 21, so as to further reduce particles otherwise generated because of friction.

Figure 3B:
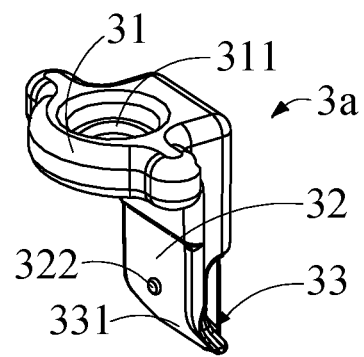
FIG. 3B is a perspective view of the second aspect of the positioning member according to an embodiment of the present disclosure.

Referring to FIG. 3B, the positioning member 3a in an example for another aspect thereof has at least one bump portion 322 which extends from the inner surface of the correcting portion 32 to the storing space S. Like the rib 321 in the preceding embodiment, the bump portion 322 further reduces particles otherwise generated because of friction.

Figure 3C:
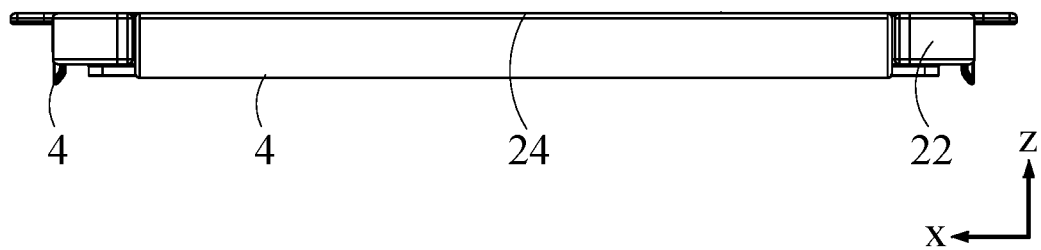
FIG. 3C is a perspective view of the third aspect of the positioning member according to an embodiment of the present disclosure.

Referring to FIG. 3C, the positioning member in an example for another aspect thereof is a slender lateral plate 4 which substitutes for two positioning members otherwise disposed at two ends of one edge, respectively, thereby attaining enhanced, firm positioning capability.

Referring to FIG. 2, in this embodiment, the connecting portions 31 of the positioning members 3a, 3b, 3c, 3d, 3e, 3f, 3g, 3h are connected to the edges 24 of the lid 22, whereas each edge 23 of the base 21 has an inner retracted segment 211 and an outer expanded segment 212. The inner retracted segment 211 corresponds in position to the positioning member 3b. The inner retracted segment 211 and outer expanded segment 212 jointly limit the position of the positioning member 3b and assist with the positioning of the lid 22.

Referring to FIG. 6A and FIG. 6B, a positioning member 6 in an example for another aspect thereof comprises a correcting portion 62 and a guiding slope portion 63 which are elastomer. Compared with the rigid correcting portion 32 and guiding slope portion 33 in the preceding aspect, the correcting portion 62 and guiding slope portion 63 are elastic and thus deformable under an applied force, such that the positioning member 6 clamps and fixes the base 21 and lid 22 together because of the elastic correcting portion 62 and guiding slope portion 63 despite tolerance in the dimensions of the base 21 and lid 22. In this embodiment, the elastic correcting portion 62 and guiding slope portion 63 fit to the base 21 and lid 22 tightly and thus decrease friction between the positioning member 6, base 21 and lid 22. The connecting portion 61 is rigid or elastic, but the present disclosure is not limited thereto.

Referring to FIG. 7A and FIG. 7B, a positioning member 6a in an example for another aspect thereof comprises a connecting portion 61, a correcting portion 62a and a guiding slope portion 63a. The correcting portion 62a and guiding slope portion 63a are not necessarily rigid or elastic. The positioning member 6a further has a clamping element 64 disposed on the inner surface of the correcting portion 62a and facing the storing space S. The clamping element 64 is a soft, elastic bar or is covered with a coating layer (for example, coated with Teflon). After the lid 22 has shut relative to the base 21, the clamping element 64 clamps and fixes the base 21 and lid 22 together, such that the base 21 and lid 22 cannot move in X-axis direction or Y-axis direction or rotate, thereby reducing friction between the positioning member 6a, base 21 and lid 22.

Figure 4:
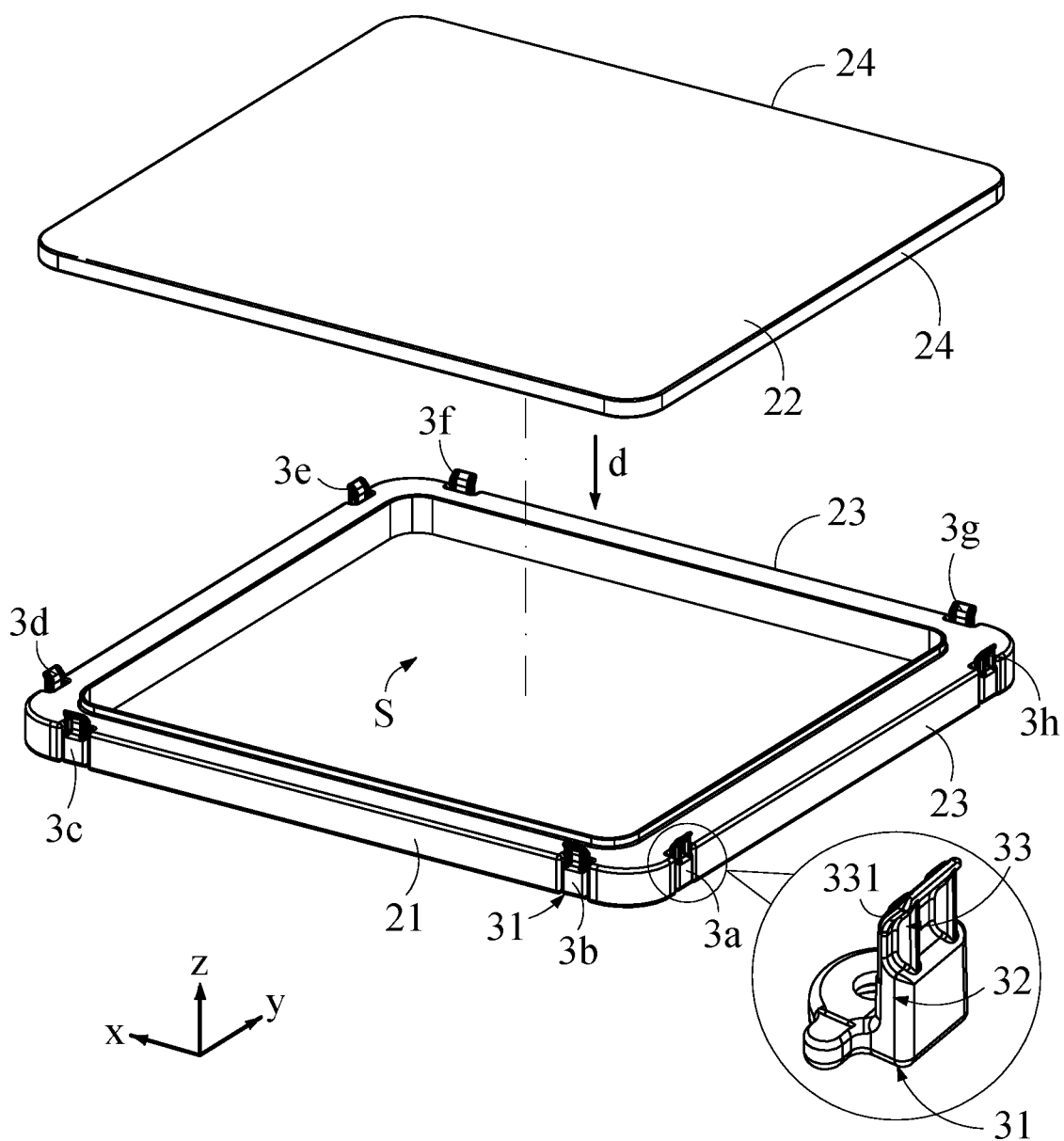
FIG. 4 is an exploded view of a reticle pod having a positioning member according to the second embodiment of the present disclosure.

Referring to FIG. 4, the second embodiment differs from the first embodiment. In the second embodiment, a reticle pod 200 having a positioning member has its positioning members arranged in the shutting direction d of the lid 22 and disposed on at least two edges 23 of the base 21, respectively. In this embodiment, the connecting portions 31 of the positioning members 3a, 3b, 3c, 3d, 3e, 3f, 3g, 3h are connected to the edges 23 of the base 21, whereas each correcting portion 32 has one end connected to the connecting portion 31 and an opposing end connected to the guiding slope portion 33. The guiding slope portion 33 has a slope 331 (i.e., the guiding slope portion 33 faces upward) extending outward. If there is an alignment error in X-axis direction or Y-axis direction while the lid 22 is shutting relative to the base 21, the lid 22 moves along the guiding slope portion 33 and thus is guided to the correct position.

Figure 5:
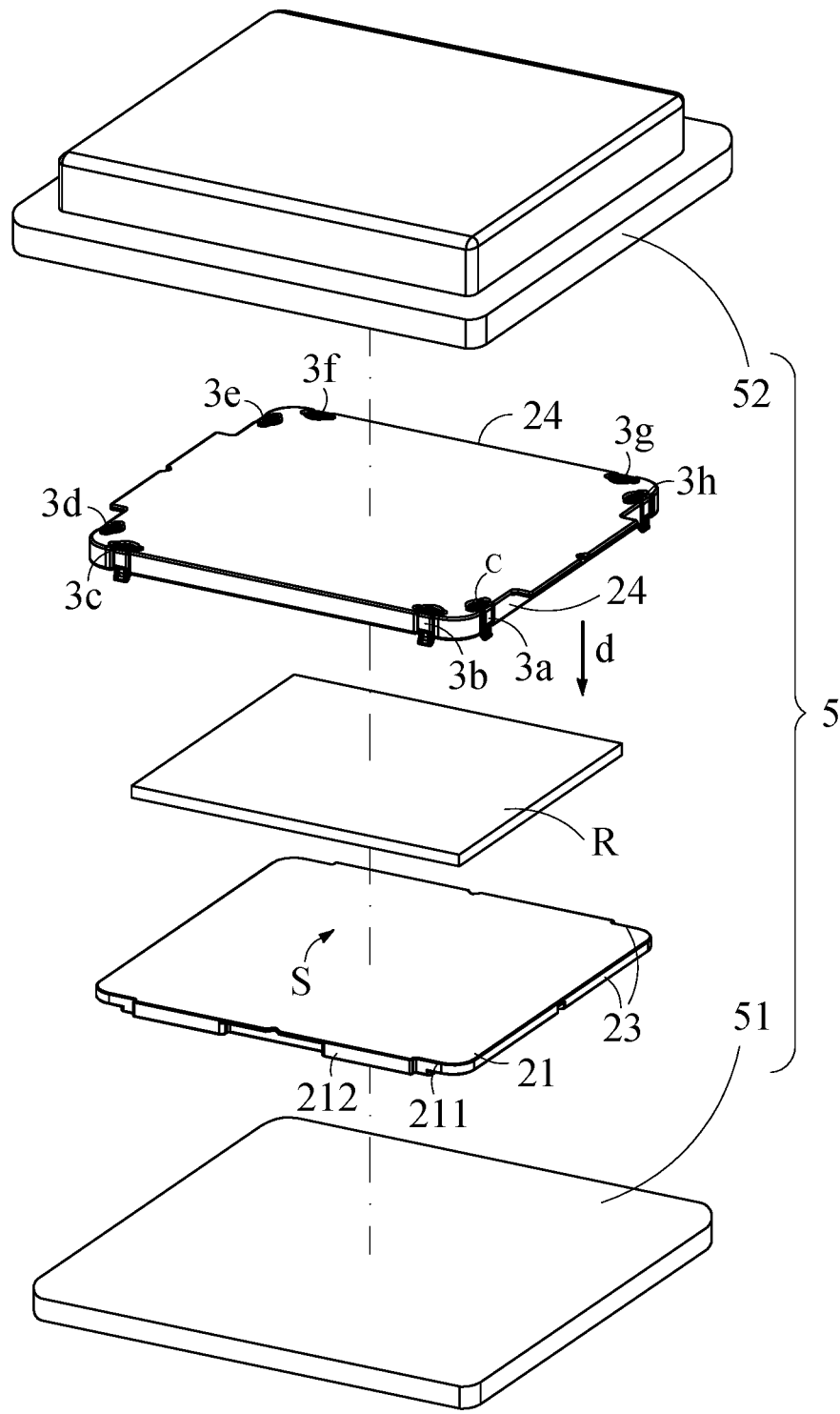
FIG. 5 is an exploded view of a reticle pod having a positioning member according to the third embodiment of the present disclosure.

Referring to FIG. 5, in the third embodiment of the present disclosure, a reticle pod 300 having a positioning member further comprises an outer case 5. The outer case 5 comprises an outer case lid 52 and an outer case base 51. When the outer case lid 52 shuts relative to the outer case base 51, the outer case 5 provides therein a placement space for holding the case 2 jointly formed by the lid 22 and base 21, whereas the reticle R is received in the storing space S of the case 2, thereby providing dual protection to the reticle R.

While the present disclosure has been described by means of specific embodiments, numerous modifications and variations could be made thereto by those skilled in the art without departing from the scope and spirit of the present disclosure set forth in the claims.

What is claimed is:

1. A reticle pod having a positioning member, comprising:
   a base having a plurality of edges;
   a lid having a plurality of edges and adapted to shut relative to the base so as to form a substantially cuboid case, the case having a storing space for receiving a reticle; and
   a plurality of positioning members arranged in a shutting direction and disposed on at least two edges of the lid, respectively, the positioning members each comprising a connecting portion, a correcting portion and a guiding slope portion, the connecting portion being connected to the edges of the lid, wherein the correcting portion has an end connected to the connecting portion and extending in the shutting direction and an opposing end connected to the guiding slope portion, the guiding slope portion having a slope extending outward.

2. The reticle pod having a positioning member according to claim 1, wherein the positioning member further has at least one rib extending from an inner surface of the correcting portion to the storing space.

3. The reticle pod having a positioning member according to claim 1, wherein the positioning member further has at least one bump portion extending from an inner surface of the correcting portion to the storing space.

4. The reticle pod having a positioning member according to claim 1, wherein the positioning member is a slender lateral plate.

5. The reticle pod having a positioning member according to claim 1, wherein the edges of the base each have an inner retracted segment corresponding in position to the positioning member.

6. The reticle pod having a positioning member according to claim 1, wherein the connecting portion has a screw hole.

7. The reticle pod having a positioning member according to claim 1, wherein the correcting portion and the guiding slope portion are elastomer.

8. The reticle pod having a positioning member according to claim 1, wherein the positioning member further has a clamping element disposed on an inner surface of the correcting portion and facing the storing space.

9. The reticle pod having a positioning member according to claim 1, further comprising an outer case, the outer case comprising an outer case lid and an outer case base, wherein the outer case provides therein a placement space for holding the case when the outer case lid shuts relative to the outer case base.

10. A reticle pod having a positioning member, comprising:
    a base having a plurality of edges;

a lid having a plurality of edges and adapted to shut relative to the base so as to form a substantially cuboid case, the case having a storing space for receiving a reticle; and a plurality of positioning members arranged in a shutting direction and disposed on at least two edges of the base, respectively, the positioning members each comprising a connecting portion, a correcting portion and a guiding slope portion, the connecting portion being connected to the edges of the lid, wherein the correcting portion has an end connected to the connecting portion and extending in the shutting direction and an opposing end connected to the guiding slope portion, the guiding slope portion having a slope extending outward.

* * * * *